US008841764B2

(12) United States Patent
Poletto et al.

(10) Patent No.: US 8,841,764 B2
(45) Date of Patent: Sep. 23, 2014

(54) SUPERCONDUCTING QUANTUM CIRCUIT HAVING A RESONANT CAVITY THERMALIZED WITH METAL COMPONENTS

(75) Inventors: Stefano Poletto, West Harrison, NY (US); Chad T. Rigetti, Somers, NY (US); Matthias Steffen, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 13/362,366

(22) Filed: Jan. 31, 2012

(65) Prior Publication Data
US 2013/0196855 A1 Aug. 1, 2013

(51) Int. Cl.
*H01L 39/14* (2006.01)

(52) U.S. Cl.
USPC .......................................................... 257/712

(58) Field of Classification Search
CPC ....... H01L 39/14; G06N 99/002; F17C 3/085; H05K 7/20372; Y02E 40/648
USPC .......................................................... 257/712
See application file for complete search history.

(56) References Cited

U.S. PATENT DOCUMENTS

| | | | |
|---|---|---|---|
| 5,934,077 A * | 8/1999 | Martinis | 62/3.1 |
| 6,184,757 B1 * | 2/2001 | Rosenthal et al. | 333/99 S |
| 6,960,780 B2 | 11/2005 | Blais et al. | |
| 7,135,701 B2 | 11/2006 | Amin et al. | |
| 2004/0145366 A1 * | 7/2004 | Baudenbacher et al. | 324/248 |
| 2009/0074355 A1 | 3/2009 | Beausoleil et al. | |
| 2010/0157552 A1 | 6/2010 | Thom et al. | |
| 2011/0022340 A1 | 1/2011 | DiVincenzo et al. | |
| 2011/0022820 A1 | 1/2011 | Bunyk et al. | |
| 2012/0319085 A1 | 12/2012 | Gambetta et al. | |

OTHER PUBLICATIONS

Paik et al. "Observation of High Coherence in Josephson Junction Qubits Measured in a Three-Dimensional Circuit QED Architecture", Physical Review Letters, PRL 107, 240501 (2011).*
Benvenuti et al., "Superconducting 500 MHz Accelerating Copper Cavities Sputter-Coated With Niobium Films", SRF84-34, Proceedings of SRF Workshop 1984, Geneva, Switzerland.*
Accuratus, "Aluminum Oxide Al2O3." [retrieved on Jun. 30, 2013]. Retrieved from the Internet: <URL: http://web.archive.org/web/20110503231304/http://accuratus.com/alumox.html>, 3 pages.
Castellano et al., "Deep-well ultrafast manipulation od a SQUID flux qubit." Cornall University Library, May 19, 2010. [retrieved on Jun. 30, 2013], Retrieved from the internet: <URL: http://arxiv.org/abs/0909.2499> 13 pages.
International Search Report and Written Opinion; International Application No. PCT/US2012/068127; International Filing Date: Dec. 6, 2012; Date of mailing: Aug. 6, 2013; 12 pages.

(Continued)

*Primary Examiner* — Andy Huynh
*Assistant Examiner* — Sitaramarao S Yechuri
(74) *Attorney, Agent, or Firm* — Cantor Colburn LLP; Vazken Alexanian

(57) ABSTRACT

A quantum electronic circuit device includes a housing having an internal resonant cavity, a qubit disposed within a volume of the internal resonant cavity and a non-superconducting metallic material mechanically and thermally coupled to the qubit within the internal resonant cavity and contiguously extending to the exterior of the housing.

23 Claims, 4 Drawing Sheets

(56) References Cited

OTHER PUBLICATIONS

M. Bal et al., "Measurement of magnetization dynamics in single-molecule magnets induced by pulsed millimeter-wave radiation," J. Appl. Phys., vol. 99, 2006, 08D102, 3 pages.

J. I. Colless et al., "Cryogenic High-Frequency Readout and Control Platform for Spin Qubits," arXiv:1111.6440v2 [cond-mat.mes-hall], Nov. 29, 2011, 8 pages.

D. L. Creedon et al., "Single-crystal sapphire resonator at millikelvin temperatures: Observation of thermal bistability in high-Q factor whispering gallery modes," Phys. Rev. B, vol. 82, 2010, 104305, 5 pages.

W. Guichard et al., "Superconducting quantum nano-circuits," International Journal of Nanotechnology, vol. 7, Nos. 4-8, 2010, pp. 474-496.

T. L. Robertson et al., "Superconducting quantum interference device with frequency-dependent damping: Readout of flux qubits," Phys. Rev. B, vol. 72, 2005, 024513, 9 pages.

\* cited by examiner

US 8,841,764 B2

SUPERCONDUCTING QUANTUM CIRCUIT HAVING A RESONANT CAVITY THERMALIZED WITH METAL COMPONENTS

FEDERAL RESEARCH STATEMENT

This invention was made with Government support under Contract No.: W911NF-10-1-0324 awarded by the U.S. Army. The Government has certain rights in this invention.

BACKGROUND

The present invention relates to artificial (e.g., man-made) quantum mechanical systems, and more specifically, to superconducting quantum circuits and devices suitable for operation at cryogenic temperatures.

Superconducting quantum circuits containing Josephson junctions are currently being pursued as the information-storing building blocks (i.e., quantum bits, or qubits) of a quantum computer. A basic challenge towards this goal is developing devices whose quantum coherence lasts long enough to enable control and measurement with error rates below the bounds requisite for quantum error correction.

Typical superconducting qubits are manufactured with aluminum thin films deposited on an insulating substrate of silicon or sapphire. A common known design, known in the literature as "circuit QED," involves capacitively or inductively coupling the qubit circuit to an auxiliary high quality factor (Q) microwave-frequency resonator. This resonator can play multiple roles: it can filter the electromagnetic environment seen by the qubit mode; it can be energized with a signal at or near its resonant frequency in order to produce a measurement of the state of the qubit; or, in a multiple qubit device, it can facilitate coupling of one qubit to another.

The resonator may be formed, like the qubit, from thin films, and can have lumped element or transmission line segment geometry. The circuit QED system may also be based on a three-dimensional (3D) cavity, a resonant structure into which the entire chip with the qubit patterned upon it is placed. The primary distinguishing features of 2D versus 3D circuit QED devices involve the structure used to define the conducting or superconducting boundaries of the electromagnetic eigenmode used as the linear resonant mode. In a 2D circuit QED system the mode boundaries are formed by a predominantly planar structure patterned through the same or similar process as the qubit itself (though the physical fields of the resonator mode, as with the qubit mode, may have structure in three dimensions). In a 3D circuit QED system the boundaries have features and length scales in all three spatial dimensions of roughly comparable length scales. While a 2D circuit QED system contains a resonator patterned on a chip, which along with other elements of the device is enclosed in a conducting or superconducting enclosure, a 3D circuit QED system employs as the resonator an eigenmode of the enclosure itself. The 3D circuit QED system is therefore distinguished by the absence of a planar circuit patterned on a substrate that implements the resonant mode.

In known 3D circuit QED devices the resonator is superconducting. A superconducting resonator is able to attain much higher quality factors than a normal metal resonator. A superconducting resonator can also act as a magnetic shield for the qubit. However, when a superconducting device undergoes the transition to the superconducting state at cryogenic temperatures, the thermal conductivity of the cavity walls is suppressed by several orders of magnitude. It then becomes difficult to further cool the chip and qubit, leading to insufficient thermalization of the qubit to the desired operating temperature.

Regardless of the geometry or design, in order to operate the system as an information storing quantum bit one must be able to create and sustain an arbitrary superposition of the quantum circuit eigenstates encoding for logical '0' and logical '1'. One requirement for this is that the available thermal energy be much less than the energy separation between states, $kT \ll hf$, where h is Planck's constant, f is the transition frequency between the circuit eigenstates encoding 0 and 1, T is the temperature of the qubit environment, and k is the Boltzmann constant. In order to enter the superconducting state for aluminum-based devices this temperature needs to be at or below about 1.2K. However this temperature is not sufficient for operation as a reliable quantum circuit, as typical qubit transition frequencies are in the 4 to 10 GHz range, corresponding roughly to 0.2K to 0.5K.

For this reason, operation and measurement of superconducting qubit devices is usually performed at or below about 20 mK. The typical system used to attain this temperature is a dilution refrigerator, though other systems, such as an adiabatic demagnetization refrigerator, are common. Regardless of the specific of system, the refrigerator provides, at its lowest temperature stage, a thermal reservoir at the desired operating temperature. The qubit device is mechanically and thermally anchored to this thermal reservoir. Because the known 3D circuit QED devices are based on an aluminum cavity, the qubit chip itself may not be in good thermal contact with the reservoir due to the thermal impedance of the bulk superconductor. This can occur even though the device is mechanically connected to the reservoir at the lowest temperature stage of the refrigeration system, as the superconducting walls of the cavity place a thermal impedance between the qubit chip (which is interior to those walls) and the thermal reservoir at the desired operating temperature. In known devices it is therefore very difficult to attain proper thermalization of the qubit to the desired operating temperature.

SUMMARY

Exemplary embodiments include a quantum electronic circuit device, including a housing having an internal resonant cavity, a qubit disposed within a volume of the internal resonant cavity and a non-superconducting metallic material mechanically and thermally coupled to the qubit within the internal resonant cavity and contiguously extending to the exterior of the housing.

Additional exemplary embodiments include a quantum electronic circuit system, including a housing having an internal resonant cavity, a qubit disposed within a volume of the internal resonant cavity, a cryogenic thermal reservoir below about 20 mK, provided by a dilution refrigerator or other refrigeration system, thermally coupled to the cavity housing and a non-superconducting metallic material mechanically and thermally coupled to the qubit and chip within the internal resonant cavity and contiguously extending to the exterior of the housing.

Additional exemplary embodiments include a quantum electronic circuit device, including a superconducting housing having an internal resonant cavity, a qubit disposed within a volume of the internal resonant cavity and a non-superconducting metallic material that is mechanically and thermally coupled with the qubit within the internal resonant cavity and contiguously extends to the exterior of the housing.

Additional exemplary embodiments include a quantum electronic circuit system, including a superconducting housing having an internal resonant cavity, a qubit disposed within a volume of the internal resonant cavity, a cryogenic thermal reservoir below about 20 mK thermally coupled to the resonator and a non-superconducting metallic material that is mechanically and thermally coupled with the qubit and chip within the internal resonant cavity and contiguously extends to the exterior of the housing.

Further exemplary embodiments include a quantum electronic circuit device, including a non-superconducting metallic housing having an internal resonant cavity having a thin layer of a superconducting material on much or all of its interior boundary and a qubit disposed within a volume of the internal resonant cavity, wherein the non-superconducting metallic housing is mechanically and thermally coupled to the qubit within the internal resonant cavity and contiguously extending to the exterior of the housing.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein implement a quantum electronic circuit that includes a qubit system within a resonator. The quantum electric circuit is adequately thermalized at cryogenic temperatures necessary for effective qubit operation as described further herein. In exemplary embodiments, the resonator is a metallic material, such as but not limited to Oxygen-Free High Thermal Conductivity (OFHC) copper (Cu). It will be appreciated that at the cryogenic temperatures described herein, impurities can interfere with thermal and electrical conductivity of the metallic material. Therefore copper oxide formed through the inclusion of oxygen impurities in the copper material can interfere with the thermal and electrical conductivity. As such, high purity metals such as OFHC Cu has reduced oxygen content thereby enhancing thermal and electrical conductivity at the cryogenic temperatures at which the quantum electronic circuit operates.

Figure 1:
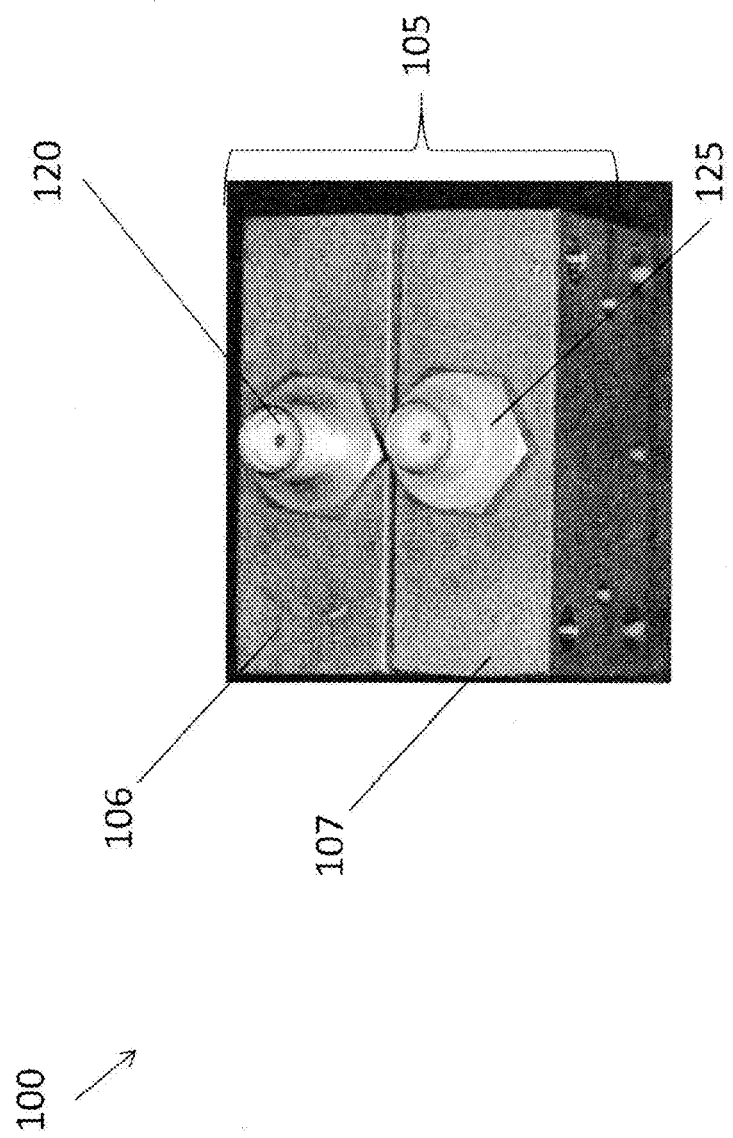
FIG. 1 illustrates an exemplary quantum electronic circuit device in an assembled state.
Figure 2:
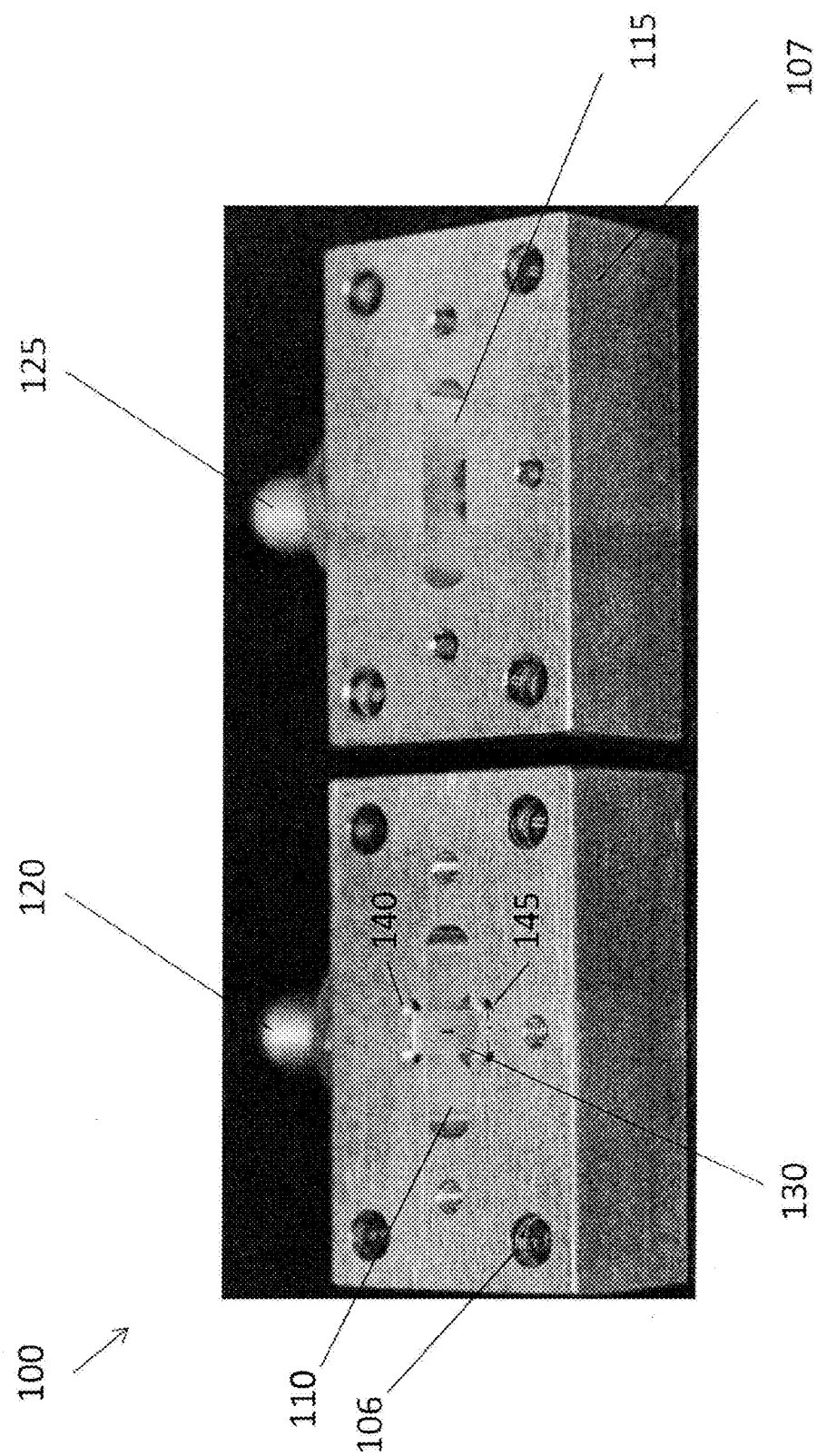
FIG. 2 illustrates the exemplary quantum electronic circuit device of FIG. 2 in an unassembled state.

FIG. 1 illustrates an exemplary quantum electronic circuit device 100 in an assembled state. FIG. 2 illustrates the exemplary quantum electronic circuit device 100 of FIG. 2 in an unassembled state. The device includes housing 105 that includes a first housing half 106 and a second housing half 107. As described herein, the first and second halves 106, 107 are a metallic material that has thermal and electrical conductivity sufficient for cryogenic temperatures such as but not limited to OFHC Cu and titanium (Ti). As described herein, known 3D circuit QED devices are made from a superconducting material that provides a good magnetic shield to external magnetic fields and suppresses the magnetic field inside the cavity. Superconducting resonators also allow high quality factors (Q) of electromagnetic eigenmodes of the cavity enclosure, while normal metal cavities are limited by the finite surface resistivity of metals at low temperatures. For a rectangular OFHC copper cavity, this limit is at about Q=10,000, while superconducting aluminum cavities can attain Q's of at least a few million. The quality factor of this mode is important as coupling of the quantum electronic circuit to it can produce a loss channel for the qubit if it is not sufficiently high. In exemplary embodiments, the limit of Q at approximately 10000 is sufficient for long-live quantum coherence, as described further herein. A cavity (resonator) is defined within the housing 105 when a first cavity half 110 and a second cavity half 115 are brought together in the assembled state. Assembled state means that the two cavity halves 110, 115 are brought together to form a single resonant volume by securing in mechanical and electrical contact a first housing half 106 with a second housing half 107, with the chip 130 secured within the cavity. The device 100 further includes one or more apertures in the cavity enclosure that allow the application of an electromagnetic field to the cavity from an external source. In present embodiments these apertures are fitted with coaxial connectors 120, 125 coupled to the housing 105 and configured to provide an electromagnetic field within the cavity when connected to an external electromagnetic field source. In this way the connectors 120, 125 act as a electromagnetic field source to the device. External field sources can include but are not limited to microwave electronic equipment that generates a signal.

Figure 3:
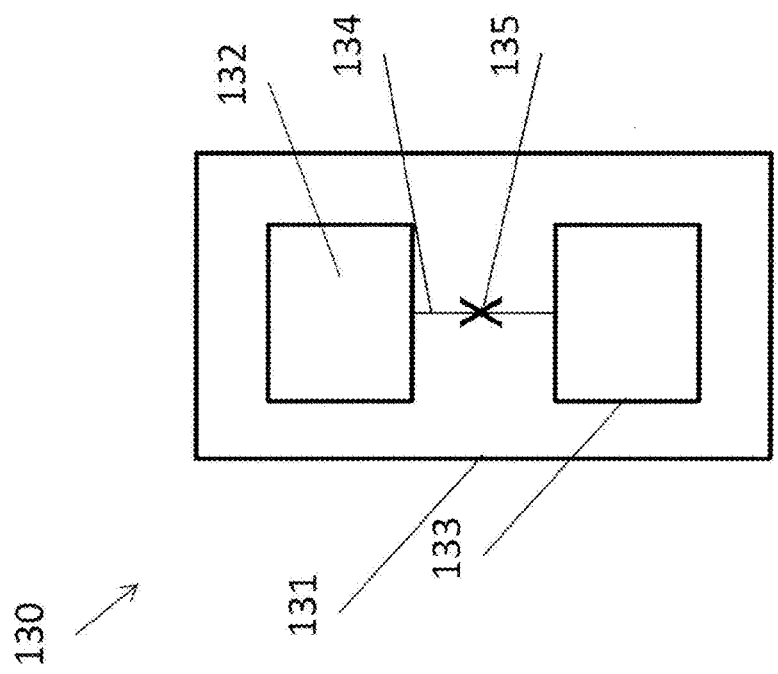
FIG. 3 illustrates an example of a qubit in accordance with exemplary embodiments.

In exemplary embodiments, the device 100 further includes a qubit 130 disposed within the housing 105 and within the cavity 110, 115 enclosed by the housing. In the examples described herein, the qubit 130 contains a Josephson junction 135. FIG. 3 illustrates an example of the qubit 130 as a superconducting transmon-style qubit. The qubit 130 includes a sapphire substrate (other substrates are possible including Silicon) 131 and two thin film aluminum capacitor pads 132, 133 connected by a short wire 134 interrupted by a single Josephson junction 135. The qubit 130 can be fabricated with a double-angle evaporation process using standard lithographic techniques. As described herein, it is appreciated that other types of superconducting qubits can be implemented including, but not limited to, a phase qubit, a fluxonium qubit, a capacitively shunted flux qubit, or any other superconducting qubit design which couples to the 3D cavity mode. Further it is appreciated that yet other types of qubits can be implemented that are based not on Josephson junctions but on quantum dots, nanowires, non-linear thin films, or electron or nuclear spins or collections thereof, among others.

The qubit 130 can be viewed as a dipole, with an associated dipole moment vector. The strength of its interaction with the cavity of the housing 105 is determined predominantly by the dot product of the dipole moment vector with the electric field vector at the location of the qubit 130. As such, adjustments of the qubit 130 location and orientation relative to the electric field profile of the mode of interest can be used to adjust the strength of qubit-cavity coupling. As such, the cavity can support multiple electromagnetic modes, with strong coupling between the cavity modes and the qubit 130. In exemplary embodiments, the electromagnetic field sources connected via the connectors 120, 125 are configured to induce a field within the cavity that produces a measurement of an eigenstate of the qubit 130. In addition, the electromagnetic field source is configured to induce transitions between eigenstates. As such, the qubit 130 has an associated transition frequency that enables the qubit 130 to transition between eignstates when induced by the applied electromagnetic field.

In exemplary embodiments, the first housing half 106 further includes recesses 140, 145 into which the qubit 130 is affixed. In this way, the qubit 130 is recessed so it has clearance when the device 100 is assembled. Furthermore the two cavity halves 110, 115 are formed in such a manner that the depth and shape of each cavity as formed in its respective housing halves 106, 107 is predominantly identical to the other, producing in the assembled state a cavity that is bisected along a symmetry axis by the mechanical and electrical contact place of the housing halves 106, 107 and thus also the cavity halves 110, 115, this symmetry notwithstanding the requirement of the recesses 140, 145 to accommodate the chip. In the assembled state the qubit 130 is disposed in the resulting internal cavity as described herein. In exemplary embodiments, the qubit 130 is thus mechanically and thermally coupled to the housing 105 through the mechanical and thermal contact of the qubit chip or substrate 131 with the housing at the location of the recesses 140, 145. The qubit 130 can be further coupled to the housing via any suitable coupling material that produces a reliable thermal and mechanical contract at the operating temperature. As described herein, the entire device 100 can be cooled to the suitable cryogenic temperature. The thermal coupling as described herein between the housing 105 and the qubit 130 allow the qubit to reach the desired cryogenic operating temperature.

As described herein, the housing 105 is machined from bulk OFHC copper. The first housing half 106 and the second housing half 107 divide the cavity (via the first cavity half 110 and the second cavity half 115) with conducting walls along a symmetry plane. The dividing plane is chosen so that the eignemode coupled to the qubit and used to control and measure the qubit 130 contains no surface currents crossing the dividing plane. For the relevant eigenmode, the surface currents flowing on the interior wall of the cavity formed by the cavity halves 110, 115 are perpendicular to the plane at which the housing halves 106, 107 are brought into contact in the assembled state.

Figure 4:
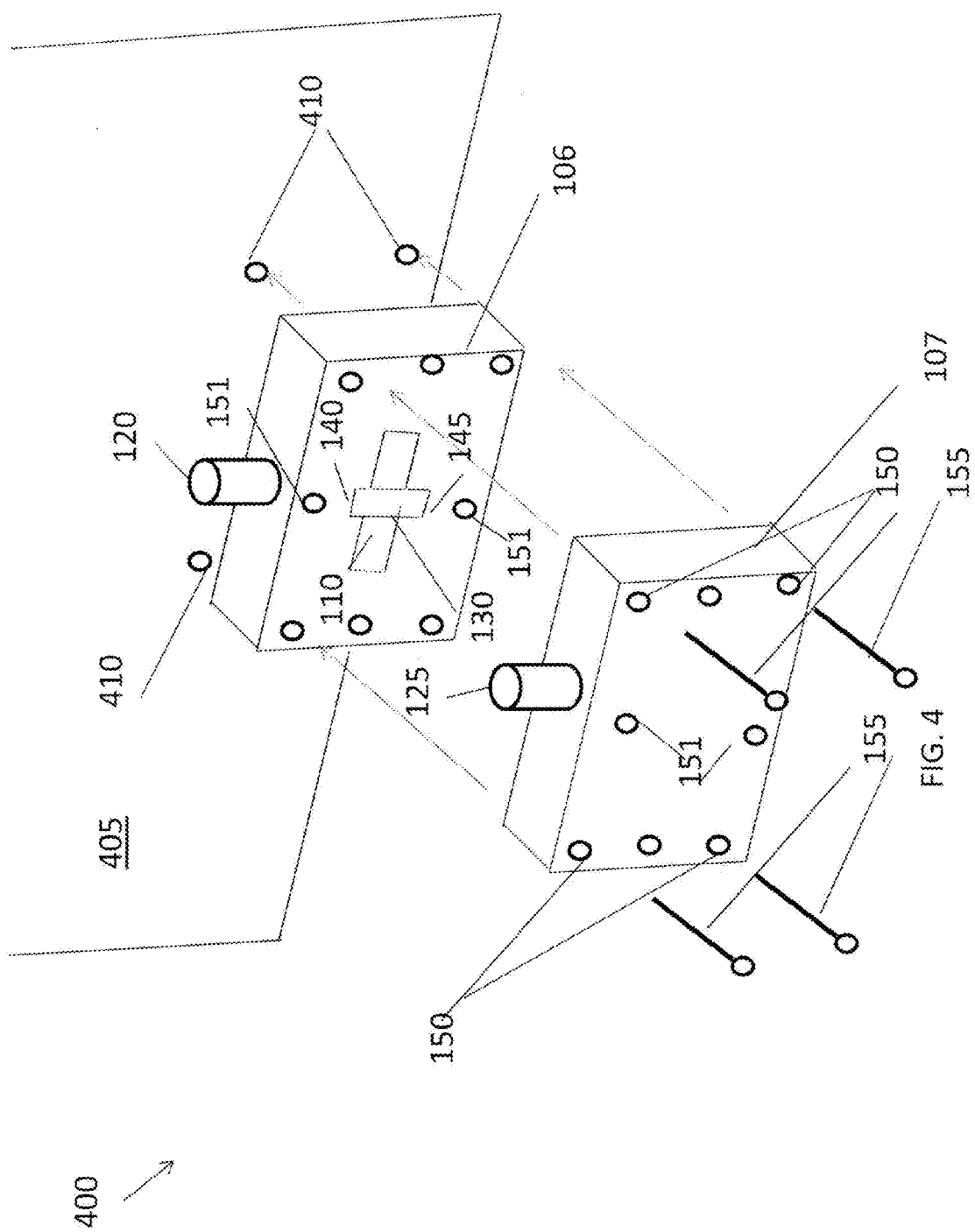
FIG. 4 illustrates an exemplary quantum electronic circuit system.

The OFHC copper cavity described in exemplary embodiments has a measured quality factor of about 10,000 at 10 mK, consistent with the known limit due to the finite surface conductivity of copper. As further described herein, the qubit 130 is disposed in the recesses 140 145 on the first housing half 106, at the center of the enclosed volume in the housing 105. The second housing half 107 is closed on top of the qubit 130. FIG. 4 illustrates an exemplary quantum electronic circuit system 400. FIG. 4 illustrates that the first housing half 106 and the second housing half 107 include holes 150 through which suitable fasteners 155, such as but not limited to, screws, mechanically secure the device 100 to a metallic part 405 contiguous with the lowest temperature stage of a dilution refrigerator or similar equipment providing the cryogenic temperatures described herein. Additional holes 151 can be include on the first housing half 106 and the second housing half 107 in order to assemble the first housing half 106 and the second housing half 107 prior to affixing the housing 105 to the metallic part 405. The metallic part 405 includes holes 410 to receive the fasteners 155. The fastening of the first housing half 106 and the second housing half 107 create a continuous metal contact between the qubit 130 and the housing 105. When measured at 10 mK, the device 100 has yielded a quantum coherence time T2* of up to 95 micro seconds.

In exemplary embodiments, a non-superconducting surface can be plated in the inside of the cavity halves 110, 115 as a thin (~1 micrometer) layer of superconducting materials such as Aluminum. In this way the cavity halves 110,115 are still thermally well equilibrated to the temperature of the dilution refrigerator because the housing halves 106, 107 remain mostly OHFC copper, and the thin layer of superconducting material is thin enough to not be a large thermal impedance. With the plating of cavity halves 110,115, much larger quality factors then Q=10,000 are possible. It is appreciated that other methods besides plating are possible to produce a thin layer of superconducting material. It is also appreciated that other platings with non-superconducting materials such as gold may be sufficient to also obtain higher quality factors than Q~10,000

Several other observations can be made of the device 100, and system 400. First, the electromagnetic modes occupy a region made up predominantly of free-space (except for the qubit substrate 131) defined by the cavity within the housing 105. The physical properties of the cavity including but not limited to the eigenmodes frequencies, quality factors, and physical field conformations can be predicted and understood through analytical treatment via Maxwell's equations and/or through electromagnetic simulation. For example, measurements indicate that the modes are entirely controlled up to a maximum characterization frequency of 27 GHz. The presence of only understood and predictable modes that occupy a free-space region means the possible sources of loss within the system are far more limited than in the planar geometry. By placing the qubit 130 inside the cavity, the profile and location of the electromagnetic fields associated with the qubit mode can be adjusted in addition to the electromagnetic field modes. It can be appreciated that appropriate modifications have to be made to the geometry of the qubit capacitance to obtain suitable capacitances for both the qubit eigenmode and the qubit-cavity coupling.

In exemplary embodiments, as described herein, the coupling of the qubit 130 to the cavity half 115 is implemented through the capacitance of the qubit circuit to the cavity walls. Measurements of the qubit 130 is performed by applying an electromagnetic field to the cavity via the connectors 120, 125 and observing the reflected or transmitted signal, whose amplitude and phase are influenced by the eignestate of the qubit 130. In exemplary embodiments it is understood that the direct coupling of the qubit to the electromagnetic field connectors is non-existent or much weaker than the coupling via the fundamental mode of the cavity. In other words, there is no meaningful direct capacitance or inductance of the qubit circuit to the electromagnetic field connectors 120, 125. All interactions of the qubit with the electromagnetic environment external to the housing 105 are mediated by and filtered by the eigenmodes of the resonant cavity 110, 115 into which the qubit is affixed.

As described herein, the resonator provides a three-dimensional empty volume with conducting walls. The volume supports an electromagnetic eigenmode that couples to the qubit 130. The qubit 130 is contacted directly by normal metal parts which are thermalized at the desired operating temperature. The implementation of metal parts overcomes the problems of thermal conductivity loss with using superconducting parts to form the resonator. The thermal conductivity of superconductors at temperatures below the transition temperature can be many orders of magnitude smaller than those of high-purity normal metals at the same temperature.

In exemplary embodiments, the device 100 can implement the normal metal parts required for thermalization by constructing the housing 105 in entirety from normal metal (excluding the qubit substrate 131 and the qubit 130). In other exemplary embodiments, the qubit insulating substrate 131 can be mechanically contacted and thereby thermally coupled to just a smaller normal metal part that pierces the walls of an otherwise superconducting 3D cavity, and this normal metal part in turn thermally coupled to a reservoir at the desired operating temperature Furthermore the housing 105 can be produced in entirety from normal metal, and subsequently coated on its interior wall a thin film of superconducting material excepting the chip seat at the recesses 140, 145 into which the chip is affixed. In this manner the cavity 110, 115 is bounded predominantly by a superconducting surface yet the contact points between the chip and the housing at the 140, 145 remain normal metal and a contiguous normal metal route is formed between the qubit chip 131 and the reservoir at the desired operating temperature. The implementation of metal directly on the qubit substrate 131 solves the problem of thermalization of the qubit and qubit substrate without the necessity of removing certain properties of having a predominantly superconducting cavity. The properties include the possibility to achieve much higher intrinsic cavity quality factors (e.g., a measured Q of an aluminum cavity of up to 4.4 million) and the shielding of the qubit from externally-produced magnetic field variations. Regardless of the implementation, the normal metal forms an uninterrupted path connecting the chip to a reservoir at a known and desired operating temperature.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A quantum electronic circuit device, comprising:
   a housing having an internal resonant cavity with major and minor cavity axes and recesses disposed outside of the cavity on opposite sides of the major cavity axis;
   a qubit disposed on a qubit substrate disposed within the recesses such that a major qubit substrate axis crosses the major cavity axis and the qubit is disposed within a volume of the internal resonant cavity; and
   a non-superconducting metallic material mechanically and thermally coupled to the qubit within the internal resonant cavity and contiguously extending to the exterior of the housing.

2. The device as claimed in claim 1 wherein the housing includes a first housing half and a second housing half.

3. The device as claimed in claim 2 wherein the first housing half includes a first cavity half and the second housing half includes a second cavity half.

4. The device as claimed in claim 3 wherein the resonant cavity is formed by the first cavity half and the second cavity half.

5. The device as claimed in claim 2 wherein the qubit substrate comprises at least one or more of sapphire and silicon.

6. The device as claimed in claim 5, wherein the recesses are formed in at least one of the first housing half and second housing half such that the recesses are recessed from a plane of a surface of the at least one of the first housing half and second housing half disposed to contact a complementary surface of the other of the at least one of the first housing half and second housing half.

7. The device as claimed in claim 6 wherein the substrate is disposed in the recesses, and is mechanically and thermally coupled to the non-superconducting metallic material, which is contiguous with a lowest temperature stage of a cryogenic temperature provider.

8. The device as claimed in claim 1 further comprising an aperture in the housing configured to couple to an electromagnetic field source or source connector.

9. The device as claimed in claim 1 wherein the non-superconducting metallic material is a good thermal conductor at cryogenic temperatures.

10. The device as claimed in claim 1 wherein the housing is at least partially the non-superconducting metallic material.

11. A quantum electronic circuit system, comprising:
    a housing having an internal resonant cavity with a cross-section including major and minor cavity axes and recesses disposed outside of the cavity on opposite sides of the major cavity axis;
    a qubit substrate including major and minor substrate axes and being disposed within the recesses such that the major substrate axis crosses the major cavity axis;
    a qubit disposed on the qubit substrate such that the qubit is disposed within a volume of the internal resonant cavity;
    a refrigeration system providing a thermal reservoir to and thermally coupled to the cavity housing; and
    a non-superconducting metallic material mechanically and thermally coupled to the qubit within the internal resonant cavity and contiguously extending to the exterior of the housing.

12. The system as claimed in claim 11 wherein the housing includes a first housing half and a second housing half.

13. The system as claimed in claim 12 wherein the first housing half includes a first cavity half and the second housing half includes a second cavity half.

14. The system as claimed in claim 13 wherein the resonant cavity is formed by the first cavity half and the second cavity half.

15. The system as claimed in claim 12 wherein the qubit substrate comprises at least one or more of sapphire and silicon.

16. The system as claimed in claim 15, wherein the recesses are formed in at least one of the first housing half and second housing half such that the recesses are recessed from a plane of a surface of the at least one of the first housing half and second housing half disposed to contact a complementary surface of the other of the at least one of the first housing half and second housing half.

17. The system as claimed in claim 16 wherein the substrate is disposed in the recesses and is mechanically and thermally coupled to the non-superconducting metallic material, which is contiguous with a lowest temperature stage of a cryogenic temperature provider.

18. The device as claimed in claim 11 further comprising an aperture in the housing configured to couple to an electromagnetic field source or source connector.

19. The system as claimed in claim 11 wherein the non-superconducting metallic material is a good thermal conductor at cryogenic temperatures.

20. The system as claimed in claim 11 wherein the housing is at least partially the non-superconducting metallic material.

21. A quantum electronic circuit device, comprising:
a superconducting housing having an internal resonant cavity with a cross-section including major and minor cavity axes and recesses disposed outside of the cavity on opposite sides of the major cavity axis;
a qubit substrate including major and minor substrate axes and being disposed within the recesses such that the major substrate axis crosses the major cavity axis;
a qubit disposed on the qubit substrate such that the qubit is disposed within a volume of the internal resonant cavity; and
a non-superconducting metallic material that is mechanically and thermally coupled with the qubit within the internal resonant cavity and contiguously extends to the exterior of the housing.

22. A quantum electronic circuit system, comprising:
a superconducting housing having an internal resonant cavity with a cross-section including major and minor cavity axes and recesses disposed outside of the cavity on opposite sides of the major cavity axis;
a qubit substrate including major and minor substrate axes and being disposed within the recesses such that the major substrate axis crosses the major cavity axis;
a qubit disposed on the qubit substrate such that the qubit is disposed within a volume of the internal resonant cavity;
a refrigeration system providing a thermal reservoir to and thermally coupled to the cavity housing; and
a non-superconducting metallic material that is mechanically and thermally coupled with the qubit within the internal resonant cavity and contiguously extends to the exterior of the housing and the refrigeration system.

23. A quantum electronic circuit device, comprising:
a non-superconducting metallic housing having an internal resonant cavity with a cross-section including major and minor cavity axes, recesses disposed outside of the cavity on opposite sides of the major cavity axis, and a layer of a superconducting material; and
a qubit substrate including major and minor substrate axes and being disposed within the recesses such that the major substrate axis crosses the major cavity axis;
a qubit disposed on the qubit substrate such that the qubit is disposed within a volume of the internal resonant cavity,
wherein the non-superconducting metallic housing is mechanically and thermally coupled to the qubit within the internal resonant cavity and contiguously extending to the exterior of the housing.

* * * * *